United States Patent
Wu et al.

(10) Patent No.: US 8,710,870 B2
(45) Date of Patent: Apr. 29, 2014

(54) POWER SUPPLY INPUT VOLTAGE DETECTION CIRCUIT

(75) Inventors: Hsin-Yi Wu, Taipei (TW); Chih-Feng Huang, Xinpu Township, Hsinchu County (TW)

(73) Assignee: Richpower Microelectronics Corporation, British West Indies (KY)

( * ) Notice: Subject to any disclaimer, the term of this patent is extended or adjusted under 35 U.S.C. 154(b) by 205 days.

(21) Appl. No.: 13/373,271

(22) Filed: Nov. 9, 2011

(65) Prior Publication Data
US 2012/0262203 A1   Oct. 18, 2012

(30) Foreign Application Priority Data
Apr. 14, 2011  (TW) .............................. 100206570 U

(51) Int. Cl.
*H03K 5/22* (2006.01)

(52) U.S. Cl.
USPC ............................................. 327/76; 327/74

(58) Field of Classification Search
USPC .......................... 327/108, 112, 50, 74, 76, 75
See application file for complete search history.

(56) References Cited

U.S. PATENT DOCUMENTS 7,576,570 B1 *  8/2009  Wong et al. ..................... 327/60
7,714,620 B1 *  5/2010  Xu .................................. 327/63

\* cited by examiner

Primary Examiner — Hai L Nguyen
(74) Attorney, Agent, or Firm — Tung & Associates

(57) ABSTRACT

The present invention discloses a power supply input voltage detection circuit. The power supply converts an input voltage to an output voltage by a transformer which includes a primary winding and a secondary winding. The primary winding is coupled to a power switch, which receives a switching signal to adjust the output voltage. The power switch is coupled to a sensing circuit; when the power switch turns ON, the sensing circuit generates a current sense signal according to current through the primary winding. The input voltage detection circuit includes: a rising time detection circuit, which detects a period of time during which the current sense signal rises from a low reference level to a high reference level to generate a timing signal; and a determination circuit, which generates a determination signal according to the timing signal for determining whether the input signal is a high voltage or a low voltage.

3 Claims, 3 Drawing Sheets

POWER SUPPLY INPUT VOLTAGE DETECTION CIRCUIT

CROSS REFERENCE

The present invention claims priority to 100206570, filed on Apr. 14, 2011.

BACKGROUND OF THE INVENTION

1. Field of Invention

The present invention relates to a power supply input voltage detection circuit; particularly, it relates to such input voltage detection circuit which detects a signal related to the rising time of the input voltage to determine whether an input voltage is a high voltage or low voltage.

2. Description of Related Art

FIGS. 1 and 2 show schematic diagrams of prior art input voltage detection circuits for power supply control circuits 11 and 13, respectively. As shown in FIG. 1, the power supply converts an input voltage Vin to an output voltage Vout by a transformer 10. The transformer 10 includes a primary winding W1 and a secondary winding W2. A power switch Q1 is coupled to the primary winding W1, and it receives a switching signal from a switching terminal GAT to adjust the output voltage Vout. A resistor Rcs is coupled to the primary winding W1, and it generates a current sense signal according to current through the primary winding W1. The current sense signal is inputted to a current sense terminal CS of the control circuit 11 or 13. The control circuits 11 and 13 control the power supplies according to the current sense signal.

The prior art shown in FIG. 1 senses a current signal related to the input voltage Vin by coupling a resistor R1 to the input voltage Vin, and duplicates the current signal by a current mirror. A resistor R2 is connected to one branch of the current mirror in series to obtain a voltage across the resistor R2, which is a signal αVin related to the input voltage Vin. The signal αVin is used to determine whether the input voltage Vin is a high voltage or low voltage. The high and low voltages refer to voltages which a general electronic product will be in contact with during operation. As one example, the high voltage is around 265V AC and the low voltage is around 90V AC, but they may vary depending on regions.

The prior art shown in FIG. 2 senses the current signal related to the input voltage Vin by coupling a resistor R3 and a resistor R4 in series to the input voltage Vin, and obtaining the signal αVin related to the input voltage Vin by the divided voltage across the resistor R4, which is used for determining whether the input voltage Vin is a high voltage or a low voltage.

In both the aforementioned prior art control circuits 11 and 13, a specific node is required to Obtain a voltage or current signal related to the input voltage Vin. This means that an extra pin is required if the control circuits 11 and 13 are integrated into integrated circuits (ICs) respectively, and the manufacturing cost and space for the ICs are increased. Besides, both the aforementioned prior art circuits require additional resistors (R1 or R3 and R4) coupled to the input voltage Vin for obtaining the signal related the input voltage Vin, and this will increase power consumption and manufacturing cost.

In view of above, to overcome the drawbacks in the prior art, the present invention proposes a power supply input voltage detection circuit which determines whether the input voltage is a high or low voltage without requiring an extra pin of the integrated circuit.

SUMMARY OF THE INVENTION

The objective of the present invention is to provide a power supply input voltage detection circuit.

To achieve the objective mentioned above, the present invention provides a power supply input voltage detection circuit, the power supply converting an input voltage to an output voltage by a transformer which includes a primary winding and a secondary winding, wherein the primary winding is coupled to a power switch, which receives a switching signal to adjust the output voltage, the power switch being electrically coupled to a sensing circuit, when the power switch turns ON, the sensing circuit generates a current sense signal according to current through the primary winding, the input voltage detection circuit comprising: a rising time detection circuit, which detects a period of time during which the current sense signal rises from a low reference level to a high reference level to generate a timing signal; and a determination circuit, which generates a determination signal according to the timing signal for determining whether the input signal is a high voltage or a low voltage.

In the aforementioned input voltage detection circuit, the rising time detection circuit preferably includes: a first comparator, which compares the current sense signal with the low reference level, and outputs a first signal according to the comparison result; a second comparator, which compares the current sense signal with the high reference level, and outputs a second signal according to the comparison result; and a logic gate, which receives the first signal and the second signal to generate the timing signal for indicating the period of time during which the current sense signal rises from the low reference level to the high reference level.

In one preferred embodiment, the determination circuit includes a timer.

The objectives, technical details, features, and effects of the present invention will be better understood with regard to the detailed description of the embodiments below.

DESCRIPTION OF THE PREFERRED EMBODIMENTS

Figure 1:
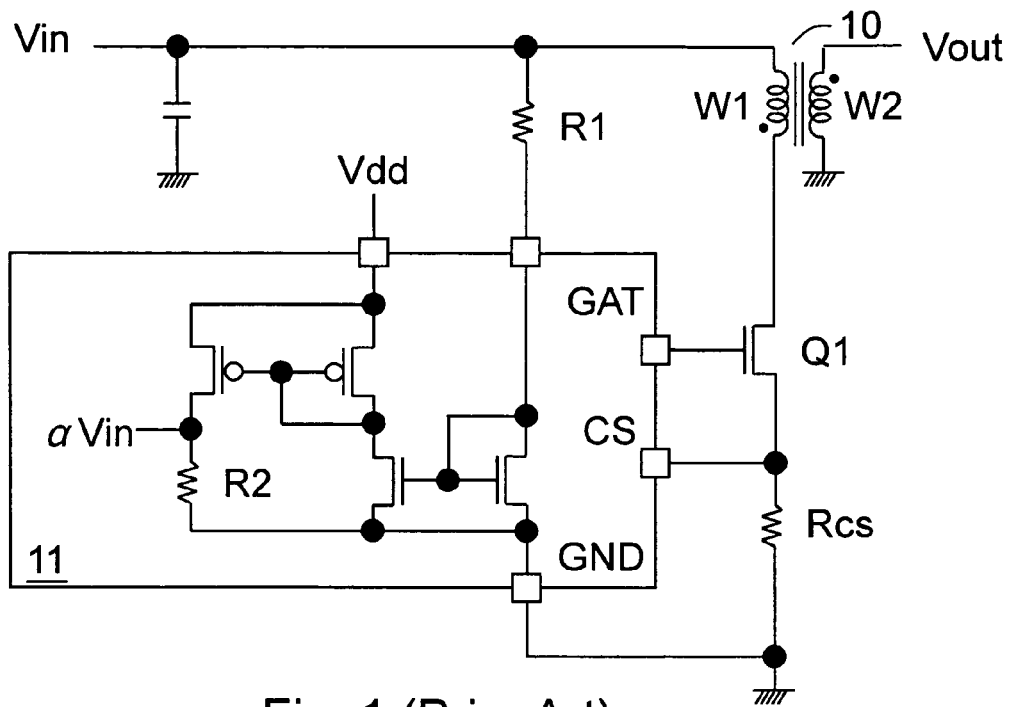
FIGS. 1 and 2 show schematic diagrams of prior art input voltage detection circuits for power supply control circuits 11 and 13, respectively.
Figure 2:
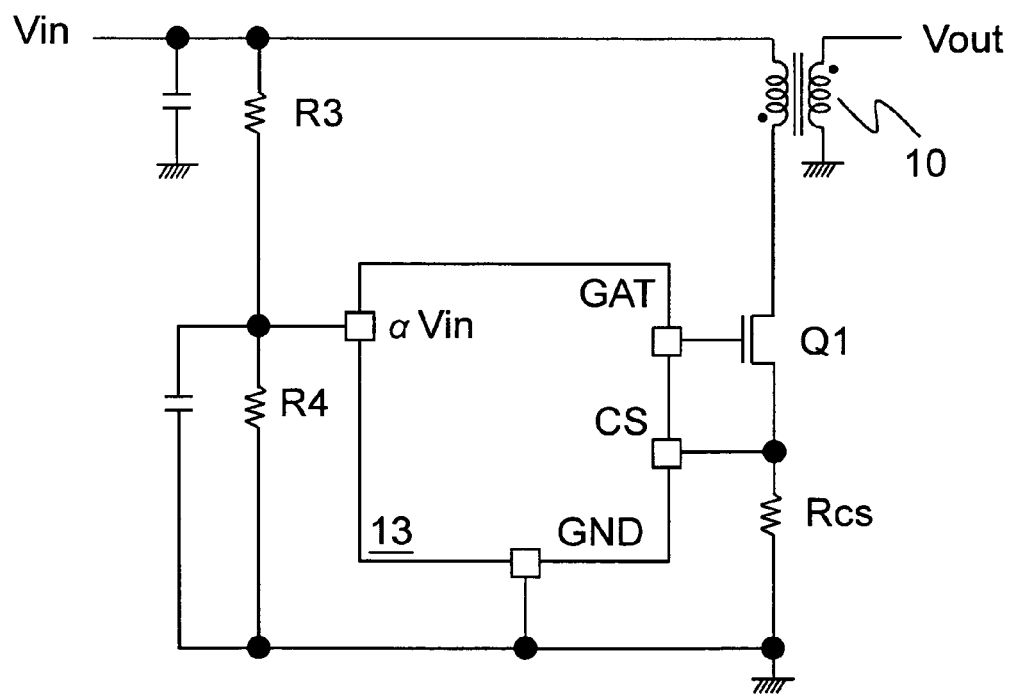
Figure 3:
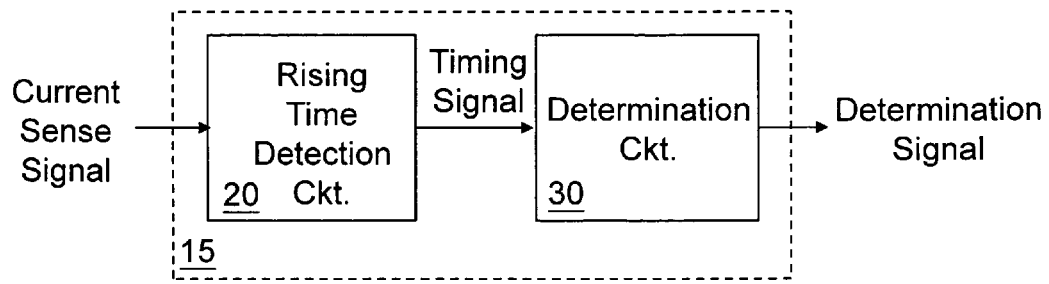
FIG. 3 is a block diagram showing the fundamental concept of the present invention.

FIG. 3 is a block diagram showing the fundamental concept of the present invention. As shown in the figure, in a control circuit 15 of a power supply, a rising time detection circuit 20 receives a current sense signal, and generates a timing signal according to the current sense signal, which is inputted to a determination circuit 30. The determination circuit 30 generates an determination signal according to the timing signal, for determining whether the input voltage is a high voltage or low voltage.

Figure 4:
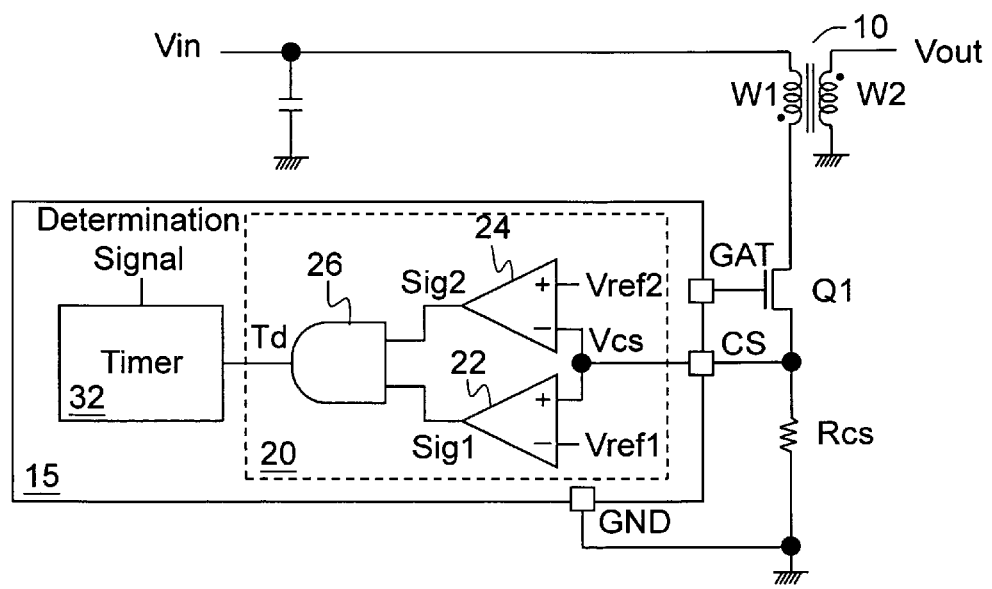
FIG. 4 shows an embodiment of the present invention.

FIG. 4 shows an embodiment of the present invention. As shown in the figure, the power supply converts an input voltage Vin to an output voltage Vout by a transformer 10, wherein the transformer 10 includes a primary winding W1 and a secondary winding W2. A power switch Q1 is coupled to the primary winding W1, and it receives a switching signal from a switching signal terminal GAT to adjust the output voltage Vout. A resistor Rcs acts as a sensing circuit which is coupled to the primary winding W1, and generates a current sense signal Vcs according to current through the primary winding W1. The current sense signal Vcs is inputted to the current sense terminal CS of the control circuit 15. The control circuit 15 controls the power supply according to the current sense signal Vcs.

Figure 5:
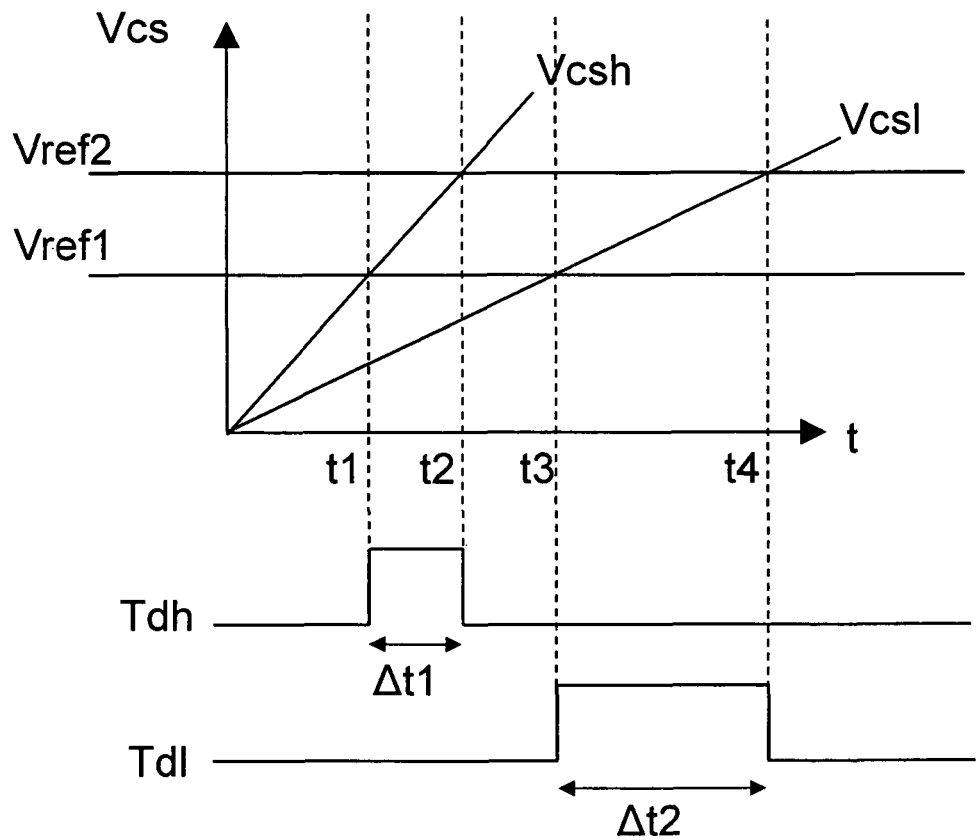
FIG. 5 is a timing diagram showing the relationship between the current sense signal Vcs and time, for better illustrating the embodiment shown in FIG. 4.

This embodiment is different from the prior art in that: in addition to original function achieved by the current sense signal Vcs, the current sense signal Vcs received by the current sense terminal CS is inputted to the rising time detection circuit 20. As shown in FIG. 5, the rising time detection circuit 20 is designed to detect a period of time during which the current sense signal Vcs rises from a low reference level Vref1 to a high reference level Vref2, to determine whether the input voltage Vin is a high voltage or low voltage.

As shown in FIG. 4, the rising time detection circuit 20 includes a first comparator 22, which compares the current sense signal Vcs with the low reference level Vref1, and outputs a first signal Sig1 according to the comparison result; a second comparator 24, which compares the current sense signal Vcs with the high reference level Vref2, and outputs a second signal Sig2 according to the comparison result; and a logic gate 26, for example but not limited to an AND gate, which receives the first signal Sig1 and the second signal Sig2 to generate the timing signal Td for indicating the period of time during which the current sense signal Vcs rises from the low reference level Vref1 to the high reference level Vref2.

Still referring FIG. 4, the determination circuit 30 shown in FIG. 3 is embodied as a timer 32 in this embodiment. The timer 32 receives the timing signal Td and generates a determination signal for determining whether the input voltage Vin is a high voltage or low voltage.

FIG. 5 is a timing diagram showing the relationship between the current sense signal Vcs and time, to illustrate the operation mechanism of the rising time detection circuit 20 of the embodiment shown in FIG. 4. As shown in FIG. 5, the vertical axis indicates the magnitude of the current sense signal Vcs, and the horizontal axis indicates time. When the input voltage Vin is a high voltage, such as 200V AC or higher, for example 265V AC, the relationship between the current sense signal Vcs and time presents a faster ascending line. At the time point t1 when the level of the line Vcsh exceeds the low reference level Vref1, the timing signal Tdh changes from the low level to the high level as shown in the lower part of FIG. 5. At the time point t2 when the level of the line Vcsh exceeds the high reference level Vref2, the timing signal Tdh changes from the high level to the low level as shown in FIG. 5.

On the other hand, when the input voltage Vin is a low voltage, such as 150V AC or less, for example 90V AC, the relationship between the current sense signal Vcs and time presents a slower ascending line Vcs1. At the time point t3 when the level of the line Vcs1 exceeds the low reference level Vref1, the timing signal Td1 changes from the low level to the high level as shown in the lower part of FIG. 5. At the time point t4 when the level of the line Vcs1 exceeds the high reference level Vref2, the timing signal Td1 changes from the high level to the low level as shown in FIG. 5.

Figure 6:
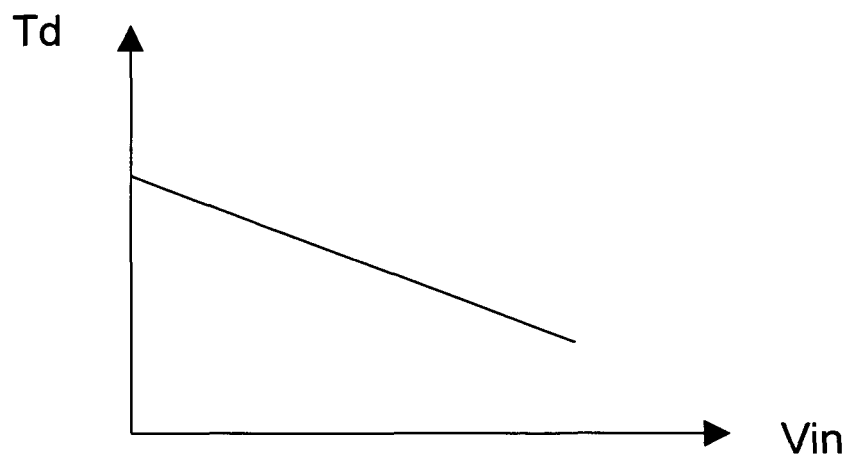
FIG. 6 is diagram showing the relationship between a timing signal Td and the input voltage Vin.

The time periods of the timing signals Tdh and Td1 at high level are $\Delta t1$ and $\Delta t2$ respectively, and $\Delta t1$ is less than $\Delta t2$. That is, when the input voltage Vin is higher, the period of the timing signal Td at high level is shorter, as shown by FIG. 6 which illustrates the relationship between the timing signal Td and the input voltage Vin. That is, whether the input voltage Vin is a high voltage or low voltage can be determined by the waveform of the timing signal Td, without requiring any additional pin of the control circuit 15.

The aforementioned embodiment which embodies the determination circuit 30 as the timer 32 is only an example. Various other ways can be used to achieve the function of determination. For example, whether the input voltage Vin is a high voltage or low voltage can be determined by judging whether a period of time wherein the timing signal Td is at high level exceeds a fixed delay time. In detail, a pulse signal can be generated after a fixed delay time from the rising edge of the timing signal Td, and a logic operation can be performed on the pulse signal and the timing signal Td, or the pulse signal can be compared with the timing signal Td, to determine whether the input voltage Vin is a high voltage or low voltage.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device which does not substantially influence the primary function of a signal can be inserted between any two devices in the shown embodiments. As another example, the positive and negative input terminals of the comparator circuits are interchangeable, with corresponding amendments to the circuit processing relevant signals. For yet another example, the logic gate 26 may be changed to another logic gate such as a NAND gate instead of the AND gate, with corresponding amendments to the determination of the timing signal Td. In view of the foregoing, the spirit of the present invention should cover all such and other modifications and variations, which should be interpreted to fall within the scope of the following claims and their equivalents.

What is claimed is:

1. A power supply input voltage detection circuit, the power supply converting an input voltage to an output voltage by a transformer which includes a primary winding and a secondary winding, wherein the primary winding is coupled to a power switch, which receives a switching signal to adjust the output voltage, the power switch being coupled to a sensing circuit, when the power switch turns ON, the sensing circuit generates a current sense signal according to current through the primary winding, the input voltage detection circuit comprising:
    a rising time detection circuit, which generates an indication signal indicating when the current sense signal rises from a low reference level and when the current sense signal reaches to a high reference level; and
    a determination circuit, which generates a determination signal according to the indication signal for determining whether the input signal is a high voltage or a low voltage.

2. The input voltage detection circuit of claim 1, wherein the rising time detection circuit includes:
    a first comparator, which compares the current sense signal with the low reference level, and outputs a first signal according to the comparison result;
    a second comparator, which compares the current sense signal with the high reference level, and outputs a second signal according to the comparison result; and
    a logic gate, which receives the first signal and the second signal to generate the indication signal for indicating the period of time during which the current sense signal rises from the low reference level to the high reference level.

3. The input voltage detection circuit of claim 1, wherein the determination circuit includes a timer.

* * * * *